United States Patent
Kitsu et al.

(10) Patent No.: US 9,238,350 B2
(45) Date of Patent: Jan. 19, 2016

(54) METHOD FOR AFFIXING WATER-AND-OIL-REPELLENT LAYER TO AMORPHOUS CARBON FILM LAYER, AND LAMINATED BODY FORMED BY SAID METHOD

(75) Inventors: Katsuo Kitsu, Takasaki (JP); Kunihiko Shibusawa, Takasaki (JP); Takeshi Sato, Takasaki (JP)

(73) Assignee: TAIYO YUDEN CHEMICAL TECHNOLOGY CO., LTD., Takasaki-Shi, Gunma (JP)

( * ) Notice: Subject to any disclaimer, the term of this patent is extended or adjusted under 35 U.S.C. 154(b) by 0 days.

(21) Appl. No.: 14/124,635

(22) PCT Filed: Jun. 6, 2012

(86) PCT No.: PCT/JP2012/064578
§ 371 (c)(1),
(2), (4) Date: Jan. 15, 2014

(87) PCT Pub. No.: WO2012/169540
PCT Pub. Date: Dec. 13, 2012

(65) Prior Publication Data
US 2014/0120350 A1 May 1, 2014

(30) Foreign Application Priority Data
Jun. 6, 2011 (JP) ................................. 2011-126042

(51) Int. Cl.
*C23C 14/06* (2006.01)
*B32B 9/04* (2006.01)
(Continued)

(52) U.S. Cl.
CPC . *B32B 9/04* (2013.01); *C23C 14/06* (2013.01); *C23C 14/0605* (2013.01);
(Continued)

(58) Field of Classification Search
USPC .......................... 427/577; 428/408, 446, 447
See application file for complete search history.

(56) References Cited

U.S. PATENT DOCUMENTS 5,843,571 A * 12/1998 Sho .............................. 428/408
2010/0247917 A1 9/2010 Nitta et al.
(Continued)

FOREIGN PATENT DOCUMENTS

| CN | 102947103 | 2/2013 |
| JP | H06-215367 | 8/1994 |

(Continued)

OTHER PUBLICATIONS

Chinese Office Action dated Sep. 29, 2014 for Appln. No. 201280027270.0.
(Continued)

*Primary Examiner* — Archene Turner
(74) *Attorney, Agent, or Firm* — Pillsbury Winthrop Shaw Pittman, LLP

(57) ABSTRACT

One object is to provide a method for providing a water- and oil-repellent layer on an amorphous carbon film with excellent fixity. A method according to an embodiment of the present disclosure includes the steps of: preparing a substrate; providing, directly or indirectly on the substrate, an amorphous carbon film layer containing silicon and nitrogen in at least a surface thereof; and providing a water- and oil-repellent layer containing fluorine on the amorphous carbon film layer via a coupling agent capable of forming, with the amorphous carbon film layer, hydrogen bonds based on polarity and/or —O-M bonds (M is any one element selected from the group consisting of Si, Ti, Al, and Zr) by condensation reaction with functional groups of the amorphous carbon film.

9 Claims, 10 Drawing Sheets

(51) Int. Cl.
*C23C 16/26* (2006.01)
*C23C 16/30* (2006.01)
*C23C 16/56* (2006.01)
*C23C 28/04* (2006.01)
*B05D 5/08* (2006.01)

(52) U.S. Cl.
CPC ............ *C23C 16/26* (2013.01); *C23C 16/30* (2013.01); *C23C 16/56* (2013.01); *C23C 28/046* (2013.01); *B05D 5/083* (2013.01); *B05D 2202/25* (2013.01); *Y10T 428/30* (2015.01)

(56) References Cited

U.S. PATENT DOCUMENTS

| | | |
|---|---|---|
| 2011/0192521 A1 | 8/2011 | Ducros et al. |
| 2013/0084457 A1 | 4/2013 | Shibusawa et al. |
| 2013/0220152 A1 | 8/2013 | Shibusawa |

FOREIGN PATENT DOCUMENTS

| | | | |
|---|---|---|---|
| JP | H07-054150 A | | 2/1995 |
| JP | 2000-178738 | | 6/2000 |
| JP | 2001-195729 | * | 7/2001 |
| JP | 2001-266328 | | 9/2001 |
| JP | 2003-027214 | | 1/2003 |
| JP | 2005-146060 A | | 6/2005 |
| JP | 2010-067637 A | | 3/2010 |
| JP | 2010-202466 A | | 9/2010 |
| JP | 2011-230505 A | | 11/2011 |
| TW | 201139154 | | 11/2011 |
| WO | 2009/060602 A1 | | 5/2009 |
| WO | 2010/012879 A1 | | 2/2010 |
| WO | 2011/148718 A1 | | 12/2011 |

OTHER PUBLICATIONS

Korean Office Action dated Oct. 31, 2014 for Appln. No. 10-2013-7029847.

English-language translation of International Search Report issued Aug. 21, 2012 in WO 2012/169540 A1 (PCT/JP2012/064578) (4 pages).

Written Opinion of the International Searching Authority with English-language translation issued Dec. 6, 2013 in WO 2012/169540 A1 (PCT/JP2012/064578) (11 pages).

Chinese Office Action dated Oct. 12, 2015 for Appln. No. 201280027270.0.

Japanese Office Action dated May 19, 2015 for Appln. No. 2013-519511.

Taiwanese Office Action dated Mar. 26, 2015 for Appln. No. 101120414.

* cited by examiner

METHOD FOR AFFIXING WATER-AND-OIL-REPELLENT LAYER TO AMORPHOUS CARBON FILM LAYER, AND LAMINATED BODY FORMED BY SAID METHOD

CROSS-REFERENCE TO RELATED APPLICATIONS

This application is a U.S. National Stage application under 35 U.S.C. §371 of PCT/JP2012/064578 filed Jun. 6, 2012, which claims priority under the Paris Convention to application Ser. No. JP 2011-126042filed in Japan on Jun. 6, 2011, the entire contents of each of these applications being incorporated herein by reference,

TECHNICAL FIELD

The present disclosure relates to a method for affixing a layer formed of water-repellent and/or oil-repellent (or "water- and oil-repellent") material on a layer formed of an amorphous carbon film provided on a substrate, and to a laminated body formed by the method. Particularly, the present disclosure relates to a method for affixing a layer formed of a water- and oil-repellent material on an amorphous carbon film layer containing silicon, and to a laminated body formed by the method.

BACKGROUND

An amorphous carbon film such as a diamond-like carbon film (abbreviated as "DLC film") is excellent in abrasion resistance, slidability and strength. Therefore, amorphous carbon films are used in various fields, e.g., for protective films of various devices such as cutting tools and molds. Also, amorphous carbon films are formed on the surface of resin films or resin bottles formed of high polymer materials to serve as $H_2O$ and $O_2$ gas barrier films. Particularly, it is desired that a water- and oil -repellent layer provided on a protective film formed of an amorphous carbon film should provide excellent abrasion resistance and slidability, as well as water- and oil-repellence that inhibits adsorption of water molecules ($H_2O$) on the surface causing stains and degraded gas barrier effect.

For example, Japanese Patent Application Publication No. H06-215367 ("Patent Literature 1") relates to a protective layer of a magnetic storage medium and discloses irradiating a hard carbon protective layer with a neutral radical species (atomic gas) generated by corona discharge, followed by forming a layer including a fluorine-containing lubricant having at least one polar group. Further, Japanese Patent Application Publication No. 2001-266328 ("Patent Literature 2") discloses treating an amorphous hard carbon film surface with nitrogen plasma thereby to produce a carbon protective film containing 6 to 20 at % nitrogen within 30 Å from the surface and forming a fluorine-based lubricant layer on the carbon protective film.

Meanwhile, Japanese Patent No. 2889116 ("Patent Literature 3) discloses mixing silicon and nitrogen into an amorphous hard carbon film layer to produce an amorphous hard carbon film having excellent adhesion with a substrate and improved lubrication characteristics such as slidability and abrasion resistance. Additionally, Japanese Patent Application Publication No. 2010-67637 ("Patent Literature 4") discloses a method for affixing an adhesive agent formed of a resin on the surface of an amorphous carbon film having poor adhesion. The Patent Literature 4 discloses forming silanol groups by oxidizing the surface of an amorphous carbon film containing silicon with ultra-violet rays, followed by reacting the silanol groups with Si—OR (wherein R is a methyl group or an ethyl group) groups contained in an adhesive, and affixing the adhesive on the surface of the amorphous carbon film containing silicon via a coupling agent.

RELEVANT REFERENCES

List of Relevant Patent Literature

Patent Literature 1: Japanese Patent Application Publication No. Hei 6-215367
Patent Literature 2: Japanese Patent Application Publication No. 2001-266328
Patent Literature 3: Japanese Patent No. 2889116
Patent Literature 4: Japanese Patent Application Publication No. 2010-67637

SUMMARY

However, as disclosed in the Patent Literatures 1 and 2, a fluorine-modified lubricant layer formed on an amorphous carbon film layer cannot be efficiently retained on the amorphous carbon film layer having poor adhesion; therefore, the functions of the fluorine-based lubricant layer cannot be sufficiently utilized, and uniform oil repellence and lubrication cannot be obtained. Another problem is that the formed oil repellent agent layer and lubricant layer are not sufficiently endurable and tend to degrade. The Patent Literature 3 does not disclose a structure wherein a second layer is tightly affixed on the surface layer of the amorphous carbon film to provide water- and oil-repellence.

As proposed in the Patent Literature 4, one way to overcome the above problems is to irradiate an amorphous carbon film layer containing silicon with ultraviolet rays and thereby enhance the retention of the amorphous carbon film itself, so as to efficiently retain a silane coupling agent. However, since an amorphous carbon film is insufficiently resistant against ozone produced by ultraviolet rays, an amorphous carbon film irradiated with ultraviolet rays are degraded. Another problem is that, when the surface layer of the amorphous carbon layer is oxidized, an abnormal electrical discharge may intensely occur on a repeat plasma treatment on the film, making it difficult to form an additional film with plasma on the amorphous carbon film irradiated with ultraviolet rays or to remove the amorphous carbon film by plasma etching.

The present disclosure is to improve these conventional methods; and one object of the present disclosure is to provide a method for providing a water- and oil-repellent layer on an amorphous carbon layer with excellent fixity. Another object of the present disclosure is to provide a laminated body having a water- and oil-repellent layer tightly affixed on an amorphous carbon film. Other objects of the present disclosure will be apparent with reference to the entire description in this specification.

As a result of research aimed at the above objects, the Inventors found that, when nitrogen is added to the amorphous carbon film containing silicon, the amorphous carbon film is tightly bound to a coupling agent containing any one element selected from the group consisting of Si, Ti, Al, and Zr.

A method according to an embodiment of the present disclosure comprises the steps of: preparing a substrate; providing, directly or indirectly on the substrate, an amorphous carbon film layer containing silicon and nitrogen in at least a surface thereof; and providing a water- and oil-repellent layer containing fluorine on the amorphous carbon film layer via a coupling agent capable of forming, with the amorphous carbon film layer, hydrogen bonds based on polarity and/or —O-M bonds (M is any one element selected from the group consisting of Si, Ti, Al, and Zr) by condensation reaction with functional groups of the amorphous carbon film layer.

A method according to another embodiment of the present disclosure comprises the steps of: preparing a substrate; providing, directly or indirectly on the substrate, an amorphous carbon film layer containing silicon and nitrogen in at least a surface thereof; and providing, on the amorphous carbon film layer, a water- and oil-repellent layer comprising a fluorine-based coupling agent capable of forming, with the amorphous carbon film layer, hydrogen bonds based on polarity and/or —O-M bonds (M is any one element selected from the group consisting of Si, Ti, Al, and Zr) by condensation reaction with functional groups of the amorphous carbon film layer.

A laminated body according to an embodiment of the present disclosure comprises: a substrate; an amorphous carbon film layer containing silicon and nitrogen and provided directly or indirectly on at least one surface of the substrate; and a water- and oil-repellent layer provided on the amorphous carbon film layer via a coupling agent capable of forming, with the amorphous carbon film layer, hydrogen bonds based on polarity and/or —O-M bonds (M is any one element selected from the group consisting of Si, Ti, Al, and Zr) by condensation reaction with functional groups of the amorphous carbon film layer.

A laminated body according to another embodiment of the present disclosure comprises: a substrate; an amorphous carbon film layer containing silicon and nitrogen and provided directly or indirectly on at least one surface of the substrate; and a water- and oil-repellent layer provided on the amorphous carbon film layer and comprising a fluorine-based coupling agent capable of forming, with the amorphous carbon film layer, hydrogen bonds based on polarity and/or —O-M bonds (M is any one element selected from the group consisting of Si, Ti, Al, and Zr) by condensation reaction with functional groups of the amorphous carbon film layer.

One embodiment of the present disclosure provides a method for providing a water- and oil-repellent layer on an amorphous carbon film with excellent fixity. Another embodiment of the present disclosure provides a laminated body having a water- and oil-repellent layer tightly affixed on an amorphous carbon layer.

DESCRIPTION OF EXAMPLE EMBODIMENTS

Figure 1:
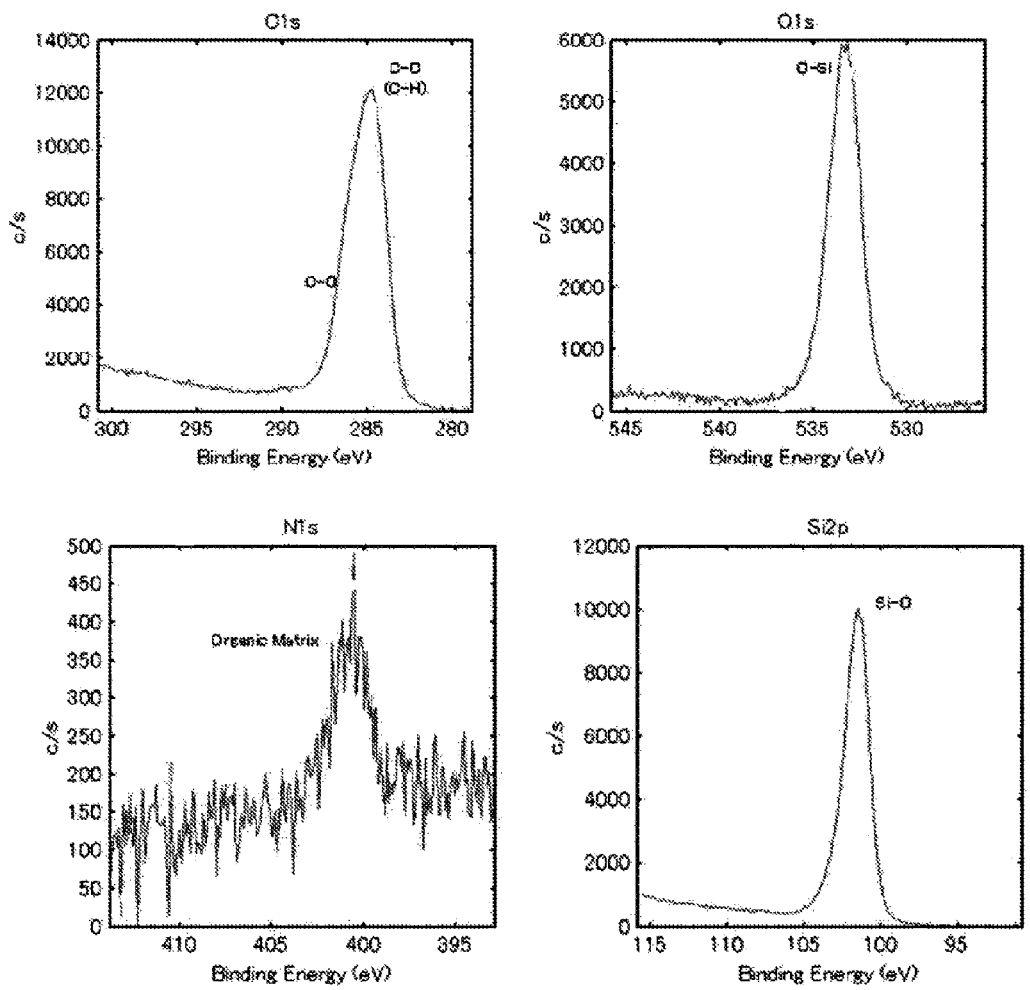
FIG. 1 shows XPS spectrum of a sample obtained as Comparative Example.

The following description is made on a method for affixing a water repellent and/or oil repellent layer on the surface of an amorphous carbon film layer provided on a substrate, and a water- and oil-repellent laminated body prepared by the method, in accordance with one embodiment of the present disclosure.

A laminated body according to an embodiment of the present disclosure may comprise a substrate, an amorphous carbon film layer provided directly or indirectly on at least one surface of the substrate, and a water- and oil-repellent layer having water repellence and/or oil repellence provided on the surface of the amorphous carbon film layer. In an embodiment, the substrate may be formed of various materials depending on the use, for example, a metal such as iron, copper, aluminum, or titanium, various alloy metal materials such as stainless steel (SUS), inorganic materials such as glass, silicon oxide, or ceramics, or a high molecule material such as polyethylene, polypropylene, polystyrene, acrylic, silicone resin, silicone compound, vinyl acetate emulsion, photopolymerized resin, or rubber. One specific example of the substrate may be (1) various molds required to have demoldability and abrasion resistance, (2) various substrate-conveying feeders, carriers, container jigs, and cutting instruments required to have abrasion resistance and high slidability and to be protected from stains (3) packaging resin films and polyethylene terephthalate (PET) bottles required to have gas barrier quality against $H_2O$, and (4) resins, rubber seals, emulsions required to have water- and oil-repellence in addition to abrasion resistance.

The amorphous carbon film layer included in the laminated body according to an embodiment of the present disclosure may be provided on the above substrate directly or indirectly via another layer such as an adhesion layer; and the amorphous carbon film layer may contain silicon and nitrogen in at least its surface. Herein, the amorphous carbon film layer containing silicon and nitrogen in at least its surface (hereinafter also called "a-C:H:Si:N film") may be obtained by, for example, the following method.

The a-C:H:Si:N film according to an embodiment of the present disclosure may contain silicon and nitrogen. The silicon content in the a-C:H:Si:N film may be 4 to 50 at %, and more desirably, 10 to 40 at %. The nitrogen content in the a-C:H:Si:N film may be 0.1 to 20 at %, and more desirably, 0.5 to 15 at %. The thickness of the a-C:H:Si:N film according to an embodiment may desirably be 1 nm to 50 μm, and more desirably, 5 nm to 3 μm; but these ranges are not limitative.

The a-C:H:Si:N film according to an embodiment of the present disclosure may be formed by mixing a hydrocarbon-based ingredient gas such as acetylene or ethylene with a gas containing silicon and a gas containing nitrogen. The a-C:H:Si:N film according to another embodiment of the present disclosure may be formed by mixing a hydrocarbon-based ingredient gas containing silicon, such as trimethylsilane, with a gas containing nitrogen. Examples of the ingredient gas may include tetramethylsilane, methylsilane, dimethylsilane, trimethylsilane, dimethoxydimethylsilane, and tetramethylcyclotetrasiloxane. The flow rate (percentage) of nitrogen in the entire flow of the ingredient gas may desirably be 0.01 to 50%, and more desirably, 0.5 to 30%; but these ranges are not limitative.

The a-C:H:Si:N film according to the embodiment of the present disclosure may be formed by, for example, the plasma CVD method that uses a reaction gas for forming a film. Particularly, the plasma CVD method under a vacuum process may be applicable. The plasma CVD method may provide wide energy distribution of dissociated atoms and ions as compared to corona discharge, ultraviolet irradiation, and ozone oxidization. Further, the plasma CVD method may relatively readily provide a high excitation energy of 5 to 9 eV that is difficult to obtain by photoreaction or heating. Thus, the plasma CVD method may enable producing various excited species. The a-C:H:Si:N film according to an embodiment of the present disclosure may be formed by the plasma CVD method, wherein, for example, the above ingredient gas is mixed with a gas containing nitrogen.

In addition, examples of the plasma CVD method used for forming the a-C:H:Si:N film according to an embodiment of the present disclosure include a high-frequency plasma CVD method using a high-frequency discharge, a direct current plasma CVD method utilizing a direct current discharge, and a microwave plasma CVD method utilizing a microwave discharge; and any plasma method that uses an ingredient gas is available. The a-C:H:Si:N film according to an embodiment of the present disclosure may be formed by a PVD method that uses solid material, wherein, for example, a sputtering gas such as Ar may be combinedly used (mixed) with the nitrogen gas and the ingredient gas. Note that conditions such as the temperature of the substrate, gas concentration, pressure, and time during the film formation may be appropriately set in accordance with the composition and the thickness of an a-C:H:Si:N film to be produced. In the case of a PVD method that uses solid carbon material (target), the formed amorphous carbon film may contain silicon, nitrogen, and carbon and be free of hydrogen.

The amorphous carbon film layer included in a laminated body according to another embodiment of the present disclosure may be formed by forming an amorphous carbon film containing silicon in at least its surface (hereinafter also called "a-C:H:Si film"), followed by plasma irradiation of the film with nitrogen or a nitrogen-containing gas such as the atmosphere. That is, the a-C:H:Si film according to the embodiment may be composed mainly of carbon (C), hydrogen (H), and silicon (Si); and its silicon content may desirably be 4 to 50 at %, and more desirably, 10 to 40 at %; but these ranges are not limitative. The thickness of the a-C:H:Si film according to the embodiment are not particularly limited but may desirably be at least 1 nm to 50 μm, and more desirably, 5 nm to 3 μm; but these ranges are not limitative.

The a-C:H:Si film according to an embodiment of the present disclosure may be formed by the plasma CVD method that uses a reaction gas, as with the a-C:H:Si:N film. The a-C:H:Si film according to an embodiment of the present disclosure may be formed by mixing a hydrocarbon-based ingredient gas such as acetylene or ethylene with an ingredient gas containing silicon. The a-C:H:Si film according to another embodiment of the present disclosure may be formed by using a hydrocarbon-based ingredient gas containing silicon, such as trimethylsilane. The a-C:H:Si film according to an embodiment of the present disclosure may be formed by the above various plasma CVD methods or PVD methods.

Next, thus formed a-C:H:Si film may be plasma-irradiated with a nitrogen gas or a nitrogen-containing gas such as the atmosphere to form an a-C:H:Si:N film. For example, after the a-C:H:Si film is formed, the ingredient gas may be exhausted; then, the a-C:H:Si film may be irradiated at the surface with a gas containing nitrogen to form the a-C:H:Si:N film.

If an amorphous carbon film containing silicon is formed and then plasma-irradiated with nitrogen, the following advantages (a) to (d) may be obtained. (a) An ordinary amorphous carbon film, particularly hydrogenated amorphous carbon film, has structure where the dangling bond of carbon constituting a main component may be terminated with a hydrogen atom; thus, the surface of the amorphous carbon film is poorly reactive with the outside. The plasma irradiation with nitrogen enables a large amount of nitrogen having a high electrical negativity to be injected into the surface of the amorphous carbon film; thus, the surface layer of the amorphous carbon film may be more likely to be electrically bonded with the outside (e.g., hydrogen bonding). Also, the plasma irradiation with nitrogen enables transformation of oil-like water repellent structure formed of C-H bonding into hydrophilic structure; thus, an adequate amount of moisture may presumably be more available in the surface layer of the amorphous carbon film, the moisture being required for hydrolysis reaction that is a bonding step of a bonding reaction of silane coupling agent, etc. Further, injection of a large amount of nitrogen having a high electrical negativity into the surface of the amorphous carbon film may provide a large surface free energy; this may quickly and uniformly spread liquids such as a coupling agent and a coupling agent containing fluorine separately applied onto the amorphous carbon film, and may prevent the film swelling into fine openings in the substrate. (b) The depth of nitrogen injection from the surface into the inside of the a-C:H:Si film may be larger when the plasma produces double charge ions rather than single charge ions, and when the acceleration voltage (applied voltage in the plasma process) of the ions is higher. Injection of nitrogen with plasma enables nitrogen ions charged with high energy to be injected into the amorphous carbon film more deeply than other methods. (c) The a-C:H:Si film may be provided with a polarity; various functional groups may be formed; and as will be described, a thin film containing fluorine may be tightly affixed; simultaneously, due to the effect of etching into the nonsmooth convexity in the surface layer of the amorphous carbon film where an electric field particularly tends to be concentrated, the surface of the a-C:H:Si film may be made more smooth. Additionally, the continuity of films as "a surface" may be attained with the thin film layer containing fluorine formed and affixed on the surface layer of the amorphous carbon film containing silicon; and the slidability caused by the physical shape (smoothness) of the surface may be improved in a structure of the amorphous carbon film including the thin film layer containing fluorine.

(d) The plasma irradiation with nitrogen after the amorphous carbon film is formed may enable a larger amount of nitrogen to be contained in the amorphous carbon film than in the case where nitrogen gas is mixed with an ingredient gas of the amorphous carbon film. That is, a layer containing a large amount of nitrogen may be formed as a water- and oil-repellent layer.

Further, an amorphous carbon film included in a laminated body according to still another embodiment of the present disclosure may be formed by appropriate combination of the above methods; for example, an a-C:H:Si:N film formed by mixing an ingredient gas with a gas containing nitrogen may be plasma-irradiated with a nitrogen-containing gas. This may enable a larger amount of nitrogen to be contained in the amorphous carbon film.

The above plasma processes using a nitrogen-containing gas may be performed in the same film-forming apparatus as that for forming the amorphous carbon film, normally without breaking a vacuum. More specifically, after the amorphous carbon film is formed, the ingredient gas of the amorphous carbon film may be exhausted to produce a vacuum, and then a nitrogen-containing gas may be introduced; or the nitrogen-containing gas may be mixed with an ingredient gas of the amorphous carbon film at a certain ratio. This may be performed subsequently to or simultaneously with formation of the amorphous carbon film.

Further, after the a-C:H:Si:N film according to the embodiments of the present disclosure is exposed under the atmosphere, an amorphous carbon film may be additionally formed on the film by a plasma CVD process. In this case, the film contains nitrogen having a high electric negativity; therefore, electric charge up and an abnormal electric discharge such as arcing may be largely suppressed as compared to the case of using, e.g., oxygen likewise having a high electric negativity. Therefore, abnormal electric discharge may be less likely to occur when, after an a-C:H:Si:N film formed by the present disclosure is exposed to the ambient atmosphere, an additional film is formed and a repeat plasma process is performed (e.g., in the case of repeatedly forming a film after wearing of used portions, or performing a masking operation with a desired pattern on a formed film and then performing a plasma process), or when the film is removed by plasma etching and a new amorphous carbon film according to the present disclosure is created again. Additionally, troubles caused by abnormal electric discharge such as arcing may be prevented, the troubles including defects in the substrate (work body) or the amorphous carbon film, breaking or failure of film formation apparatus power supply caused by abnormal electric current, and insufficient application of voltage in the plasma process.

The surface of the amorphous carbon film according to the embodiments of the present disclosure may include various functional groups due to the plasma process; therefore, when these functional groups interact with the functional groups of a fluorine-based material, the water- and oil-repellent layer formed of the fluorine-based material may be securely affixed on the surface of the amorphous carbon film.

Additionally, the amorphous carbon film according to the embodiments of the present disclosure, containing nitrogen having a high electric negativity, may be likely to undergo hydrogen boding with a silane coupling agent.

The water- and oil-repellent layer according to an embodiment of the present disclosure may have water- and oil-repellence and may be formed on the a-C:H:Si:N film described above. This water- and oil-repellent layer may be formed so as to provide the a-C:H:Si:N film with water- and oil-repellence and sophisticated qualities such as abrasion resistance, chemical resistance, low friction, nonadhesiveness, $H_2O$ barrier quality, and $O_2$ barrier quality. The amorphous carbon films according to the embodiments of the present disclosure may not have enough water repellence or oil repellence, and tend to adsorb water-based stains and oil-based stains. To overcome this problem, a structure according to the present disclosure may include a water- and oil-repellent layer having water- and oil-repellence on the the surface of the amorphous carbon film, so as to be highly stainproof and demoldable. More specifically, in an embodiment of the present disclosure, the water- and oil-repellent layer may have oil repellence and thus prevent oil from reaching the substrate through film flaws such as pin halls formed in the amorphous carbon film. Accordingly, when an amorphous carbon film and a water- and oil-repellent layer according to the embodiments of the present disclosure are formed on a substrate constituted by a material having poor solvent resistance such as water-soluble emulsion or an acrylic resin, the water- and oil-repellent layer may prevent solvent components from reaching the substrate through pin halls in the amorphous carbon film. This may prevent the solvent components from damaging the substrate.

The water- and oil-repellent layer according to an embodiment of the present disclosure may be provided on the above-described a-C:H:Si:N film via a silane coupling agent. Since the silane coupling agent may have hydrolyzable groups such as silanol groups or alkoxy groups including ethoxy groups and methoxy groups, the silane coupling agent may include an element M (M is any one element selected from the group consisting of Si, Ti, Al, and Zr) that can form, with the substrate (e.g., a-C:H:Si:N film), hydrogen bonds based on polarity and/or —O-M bonds by condensation reaction with functional groups of the substrate. The coupling agents including the element M may include, for example, titanate-based, aluminate-based, and zirconate-based coupling agents, in addition to silane coupling agent. The coupling agent may be tightly affixed on the film. The water- and oil-repellent layer according to an embodiment of the present disclosure may be formed of, for example, a fluorine resin layer, a silicone resin layer, or a fluorine-based silane coupling agent having water- and oil-repellence. In an embodiment of the present disclosure, a water- and oil-repellent layer may be provided on the a-C:H:Si:N film via the silane coupling agent; therefore, the surface layer having water- and oil-repellence may be tightly affixed on the a-C:H:Si:N film.

Additionally, a water- and oil-repellent layer according to another embodiment of the present disclosure may be formed of a fluorine-based material having hydrolyzable groups such as silanol groups or alkoxy groups including ethoxy groups and methoxy groups; and the water- and oil-repellent layer may be provided directly (that is, without a silane coupling agent) on the above-described a-C:H:Si:N film. One example of the fluorine-based material may be a fluorine-based silane coupling agent. The fluorine-based silane coupling agent may include at least a hydrolyzable group such as an alkoxy group that produces a silanol group by hydrolysis, and a group containing fluorine. A layer formed of the fluorine-based silane coupling agent may be formed on the a-C:H:Si:N film to provide the substrate surface with water- and oil-repellence. The water- and oil-repellent layer according to an embodiment of the present disclosure may be formed of a fluorine-based coupling agent including an element M (M is any one element selected from the group consisting of Si, Ti, Al, and Zr) that can form, with the substrate (e.g., a-C:H:Si:N film), hydrogen bonds based on polarity and/or —O-M bonds by condensation reaction with functional groups of the substrate. The fluorine-based coupling agent including the element M may also be tightly bound to the substrate (functional groups formed on the substrate and the polarity provided to the substrate) on the same principle as the fluorine-containing silane coupling agent. The fluorine-based coupling agents including the element M may include, for example, titanate-based, aluminate-based, and zirconate-based fluorine-containing coupling agents, in addition to fluorine-containing silane coupling agent.

The fluorine-based silane coupling agent used in an embodiment of the present disclosure is a silane-based compound wherein perfluorooctylethyl trimethoxysilane, perfluorooctylethyl tripropoxysilane, perfluorooctylethyl triaminosilane, perfluorooctylethyl trichlorosilane or the like is dissolved in a fluorine-based alcohol solvent such as isopropyl alcohol, acetone, hydrofluoroether, perfluoropolyether, hydrofluorocarbon, perfluorocarbon and hydrofluoropolyether. For example, FG-5010Z130-0.2 from Fluorosurf can be used. The fluorine-based silane coupling agents used in an embodiment of the present disclosure are not limited to those described above.

In an embodiment, the water- and oil-repellent layer formed of a silane coupling agent may be formed by, for example, applying a solution of a fluorine-based silane coupling agent onto an a-C:H:Si:N film. In another embodiment, the water- and oil-repellent layer formed of a silane coupling agent may also be formed by immersing a substrate having an a-C:H:Si:N film formed thereon into a solution of a fluorine-based silane coupling agent material and then drying the substrate. In still another embodiment, a silane coupling agent may be sprayed, for example. The water- and oil-repellent layer formed of these silane coupling agents may be tightly affixed on an a-C:H:Si:N film of the present disclosure or an a-C:H:Si:N film subjected to the plasma process with nitrogen. The thickness of the water- and oil-repellent layer of the structures in the embodiments of the present disclosure should be appropriately determined based on the material of the silane coupling agent and the water- and oil-repellent layer, and may be, for example, about 1 nm to 1 μm. However, the thickness of the water- and oil-repellent layer is not limited to the above range.

The water- and oil-repellent structure according to the present disclosure formed on an electrically conductive substrate in the form of a thin film may be made sufficiently thin, thereby minimizing the static electricity which is generated by the friction between the structure according the present disclosure and an object sliding on the surface layer of the structure and is conducted to the substrate (removal of electricity), and also minimizing the degradation of electrical conductivity to the substrate through the structure according to the present disclosure.

EXAMPLES

Next, various examples according to various embodiments of the present disclosure will be described below. The present disclosure is not limited to these examples but covers the entire scope of purport of the present disclosure.

First, a stainless steel piece (SUS304 2B) 30 mm square and 0.5 mm thick was electropolished to prepare a substrate having a surface roughness Ra of 0.02 μm. This substrate was placed on a sample table provided on a high pressure pulse plasma CVD apparatus. Then, a reaction container was closed tightly, and the air in the reaction container was exhausted to $1\times10^{-3}$ Pa. Next, the surface of the substrate was cleaned by argon (Ar) gas plasma; and then trimethylsilane (TMS) and/or nitrogen gas was introduced into the reaction container to form an amorphous carbon film (Comparative Example, Example 1, and Example 2). The conditions of forming the film are shown in the table below. Comparative Example was prepared by the following process. First, argon (Ar) gas plasma etching was performed for five minutes under the conditions shown in Table 1; and then an amorphous carbon film containing silicon was formed on the substrate with trimethylsilane as an ingredient gas under the conditions for Comparative Example shown in Table 2. The amorphous carbon film thus prepared is Comparative Example. Example 1 was prepared by the following process. First, argon (Ar) gas plasma etching was performed for five minutes under the conditions shown in Table 1; and then an amorphous carbon film containing silicon and nitrogen was formed with a mixture gas of trimethylsilane and nitrogen gas as an ingredient gas under the conditions shown in Table 2. The amorphous carbon film thus prepared is Example 1. Example 2 was prepared by the following process. First, argon (Ar) gas plasma etching was performed for five minutes under the conditions shown in Table 1; and then an amorphous carbon film containing silicon was formed with trimethylsilane as an ingredient gas under the conditions shown in Table 2. Subsequently, the amorphous carbon film was subjected to a nitrogen plasma process under the conditions shown in Table 3. The amorphous carbon film thus prepared is Example 2.

TABLE 1

① Ar Cleaning

| | Flow [sccm] | Pressure [Pa] | Voltage [kV] | Current [A] | Time [min] |
|---|---|---|---|---|---|
| Comparative Example | 30 | 2 | −5 | 0.85 | 10 |
| Example 1 | 30 | 2 | −5 | 0.85 | 10 |
| Example 2 | 30 | 2 | −5 | 0.85 | 10 |

TABLE 2

② Formation of Amorphous Carbon Film

| | Flow [sccm] | Pressure [Pa] | Voltage [kV] | Current [A] | Time [min] |
|---|---|---|---|---|---|
| Comparative Example | TMS: 30 | 2 | −5 | 2.1 | 34 |
| Example 1 | TMS: 30 $N_2$: 10 | 2 | −5 | 1.5 | 34 |
| Example 2 | TMS: 30 | 2 | −5 | 2.1 | 34 |

TABLE 3

③ $N_2$ Plasma Process

| | Flow [sccm] | Pressure [Pa] | Voltage [kV] | Current [A] | Time [min] |
|---|---|---|---|---|---|
| Comparative Example | — | — | — | — | — |
| Example 1 | — | — | — | — | — |
| Example 2 | 30 | 2 | −5 | 1.7 | 5 |

For each of the samples prepared as described above, that is, Comparative Example, Example 1, and Example 2, photoelectron energy of the surface was measured by X-ray photoelectron spectroscopy (XPS). The measurement instrument and analytical conditions were as follows.

Measurement instrument:
X-ray photoelectron spectrometer: Quantera SXM (from ULVAC-PHI, Inc.)
Analytical conditions:
Excited X-ray: Al Kα (monochrome)
Resolution (diameter): 100 μm (100 u 25 W 15 kV)
Electrification neutralization: electron/Ar ion
Pass energy: 112 eV (narrow scan)
Step size: 0.1 eV (narrow scan)

The measurement results obtained from the samples are shown in Table 4.

TABLE 4

|  | C1s | O1s | N1s | Si2p |
|---|---|---|---|---|
| Comparative Example | 61.96 | 9.81 | 0.77 | 27.45 |
| Example 1 | 58.71 | 11.24 | 2.4 | 27.65 |
| Example 2 | 21.72 | 44.12 | 13 | 21.16 |

Detected elements (narrow scan, at %)

Figure 2:
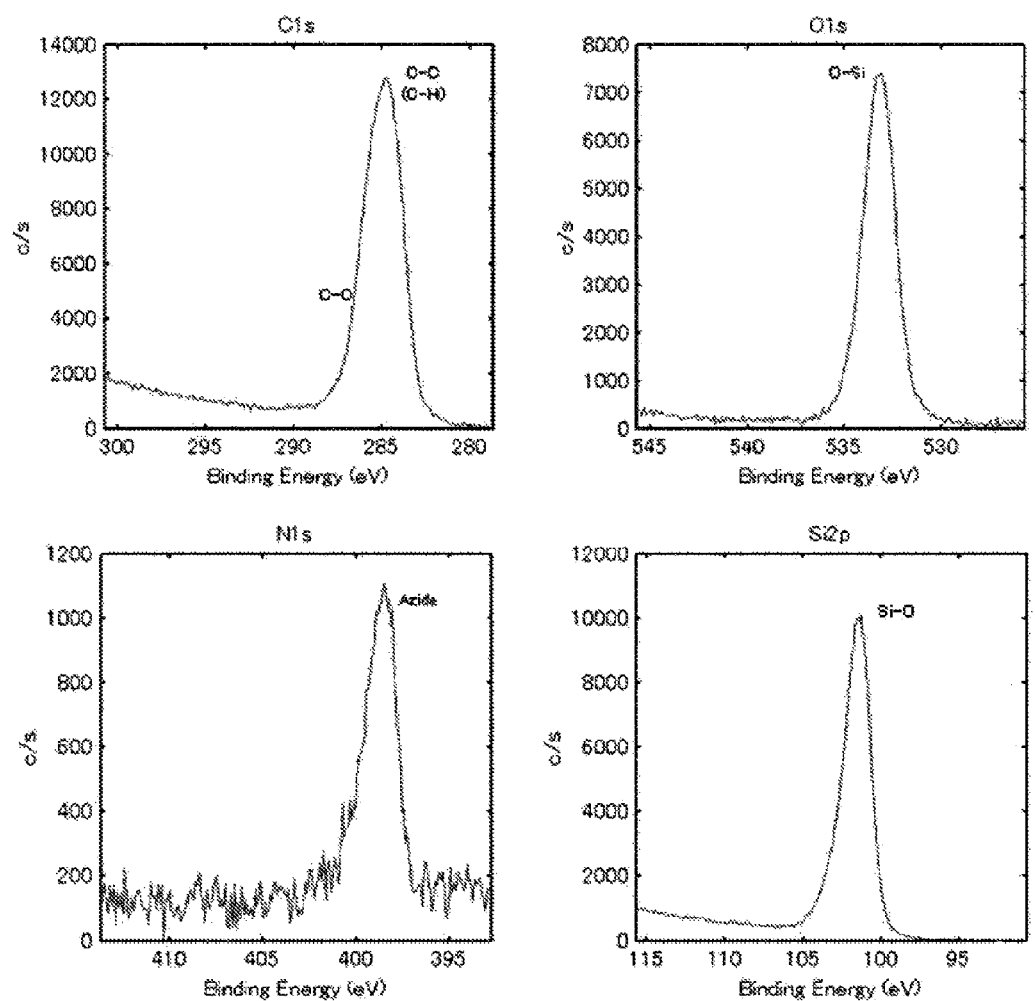
FIG. 2 shows XPS spectrum of a sample obtained as Example 1.
Figure 3:
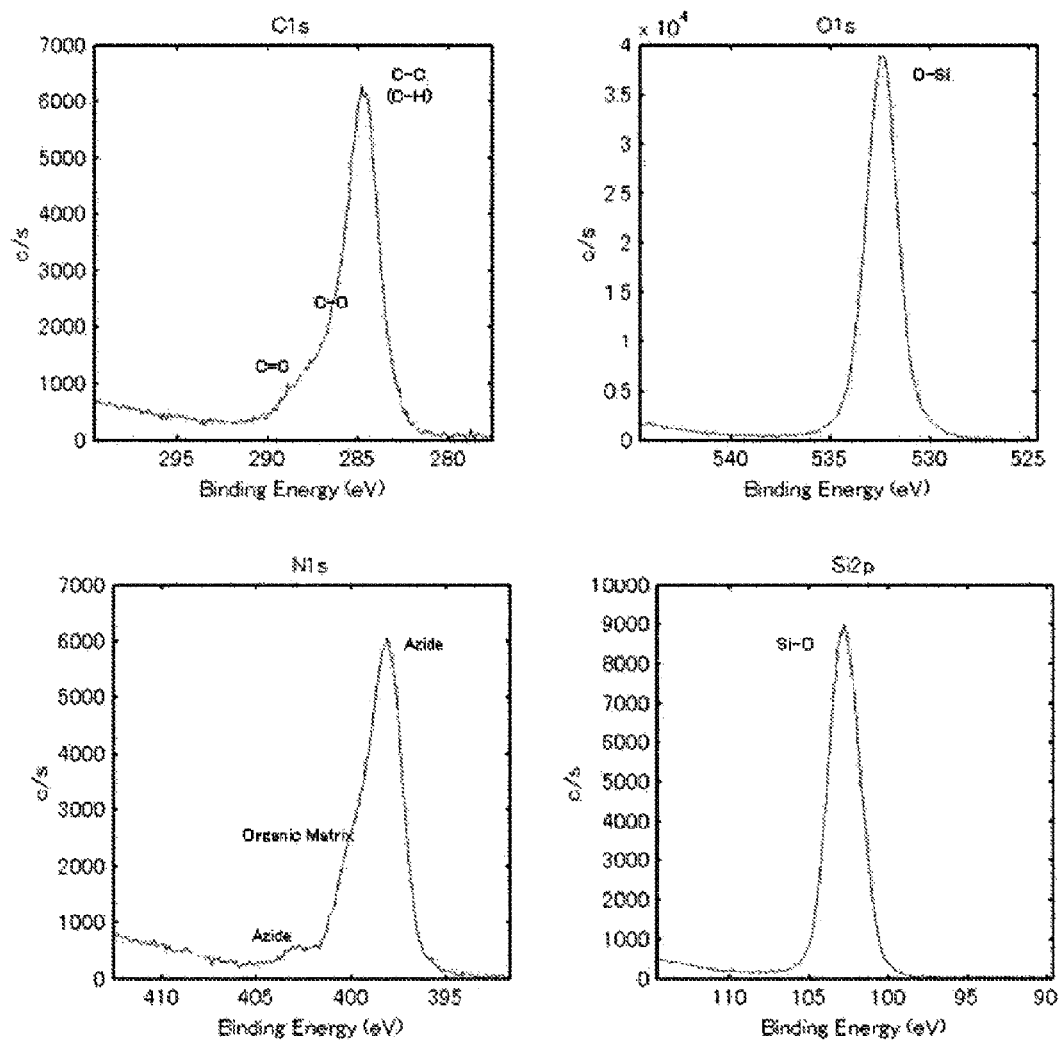
FIG. 3 shows XPS spectrum of a sample obtained as Example 2.

FIGS. 1 to 3 show XPS spectrum for each sample (narrow scan).

As shown in Table 4, it was confirmed, in both Examples 1 and 2, that the amorphous carbon film including silicon contained nitrogen. However, Example 1 contained a smaller amount of nitrogen and exhibited only bonding between nitrogen atoms, not bonding with other elements. Example 2 contained a much larger amount of nitrogen than Example 1 and exhibited bonding with carbon atoms in addition to bonding between nitrogen atoms. Further, a shoulder band caused by C=O was observed in C1s spectrum of Example 2 near the bonding energy 288 eV. This may suggest a peak by —COO— (carbonyl group) or —COOH (carboxyl group). In the sample of Example 2, these functional groups presumably increased the affinity with water having polarity to produce a high hydrophilicity. The analysis by XPS confirmed that, in both Examples 1 and 2, the amorphous carbon film including silicon contained nitrogen. Additionally, it is presumed from the result of narrow scan that Si is bound to be an oxide in any of Comparative Example and Examples 1 and 2. Example 2 exhibited peak shifts for Si2p and O1s as compared to Example 1 and Comparative Example, indicating that Example 2 is an amorphous carbon film containing silicon having different physical properties than Example 1 and Comparative Example. Also, in Example 2, a large amount of oxygen was detected.

To determine the fixation ability of a fluorine-based silane coupling agent by measuring the contact angle with water, Reference Example was prepared as follows. First, a substrate of the same stainless steel as Example 1 was prepared. Next, argon (Ar) gas plasma etching was performed on this substrate for five minutes under the conditions shown in Table 5; and then an amorphous carbon film substantially free of silicon was formed with acetylene ($C_2H_2$) gas as an ingredient gas under the conditions shown in Table 6. Next, this amorphous carbon film was irradiated with nitrogen plasma under the conditions shown in Table 7 to obtain Reference Example.

TABLE 5

| ① Ar Cleaning (5 min.) | | | | | |
|---|---|---|---|---|---|
|  | Flow [sccm] | Pressure [Pa] | Voltage [kV] | Current [A] | Time [min] |
| Reference Example | 30 | 2 | −5 | 0.85 | 10 |

TABLE 6

| ② Formation of Amorphous Carbon Film Free of Silicon | | | | | |
|---|---|---|---|---|---|
|  | Flow [sccm] | Pressure [Pa] | Voltage [kV] | Current [A] | Time [min] |
| Reference Example | $C_2H_2$: 30 | 2 | −5 | 1.6 | 34 |

TABLE 7

| ③ $N_2$ Plasma Process | | | | | |
|---|---|---|---|---|---|
|  | Flow [sccm] | Pressure [Pa] | Voltage [kV] | Current [A] | Time [min] |
| Reference Example | 30 | 2 | −5 | 1.7 | 5 |

Next, the samples of Example 1, Example 2, Comparative Example, and Reference Example exposed to normal-pressure atmosphere (at a temperature of 25° C. and a humidity of 30%) for 24 hours were dipped into a solution of FG-5010Z130-0.2 from Fluorosurf (containing 0.02 to 0.2% fluorine resin and 99.8 to 99.98% fluorine-based solvent) for application thereof, and were dipped again 90 minutes after, and were then dried naturally at a room temperature and a humidity of 45% for 20 hours. Next, the samples are subjected to ultrasonic cleaning in acetone; and Example 1, Example 2, and Comparative Example were measured for contact angles with water at five minutes, two hours, and eight hours after the ultrasonic cleaning. Reference Example was measured for contact angle with water at five minutes and two hours after the ultrasonic cleaning. Each contact angle was measured using a mobile contact angle measurement device PG-X manufactured by Fibro system AB under the environment of a temperature of 25° C. and a humidity of 30%. Water used in the measurement of contact angles was pure water.

The ultrasonic wave washer used in the measurement was US-20KS manufactured by SND Co., Ltd, with oscillation 38 kHz (BLT self-oscillation) and high frequency output 480 W. In ultrasonic cleaning, strong vibrations were locally generated by a piezoelectric vibrator to generate cavities in acetone. When the cavities crush on the surface of the substrate, the crushed cavities generate a great physical impact force on the surface of the substrate; therefore, it is convenient and suitable to determine the adhesion power between the substrate and a second layer tightly affixed thereto.

For reference, FIG. 8 shows the contact angles with water and adhesion energy for fluorine-based material exhibiting the highest water repellence and a silicon-based material exhibiting the second highest water repellence, that is, a silicon resin, as well known referential examples.

TABLE 8

| Material | Contact Angle with Water (°) | Adhesion Energy to Water (dyne/cm) |
|---|---|---|
| Fluorine Resin | 115 | 43 |
| Silicone Resin | 100 | 50 |

Figure 4A:
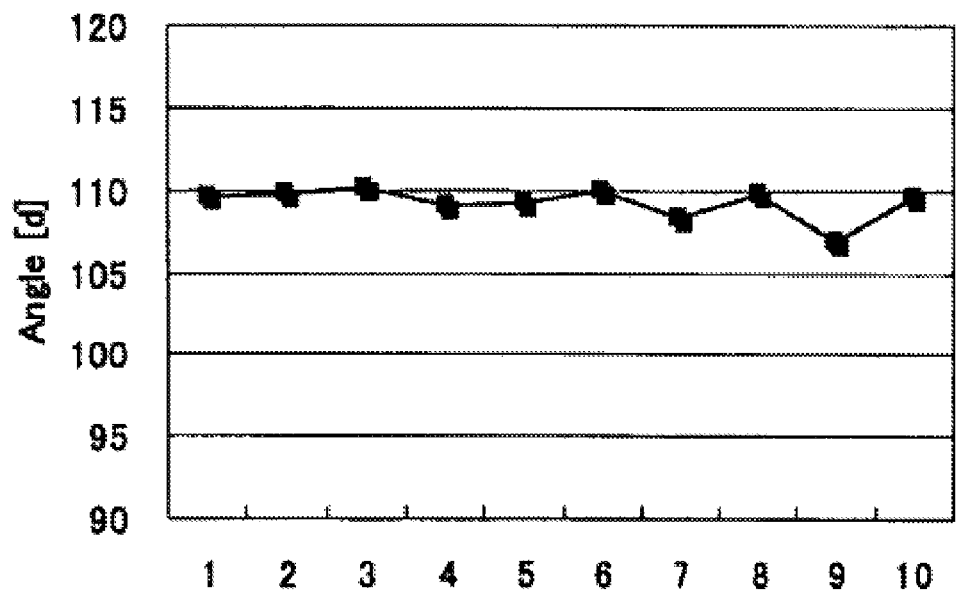
FIG. 4A shows data on contact angles with water after five minutes of ultrasonic cleaning of Reference Example.
Figure 4B:
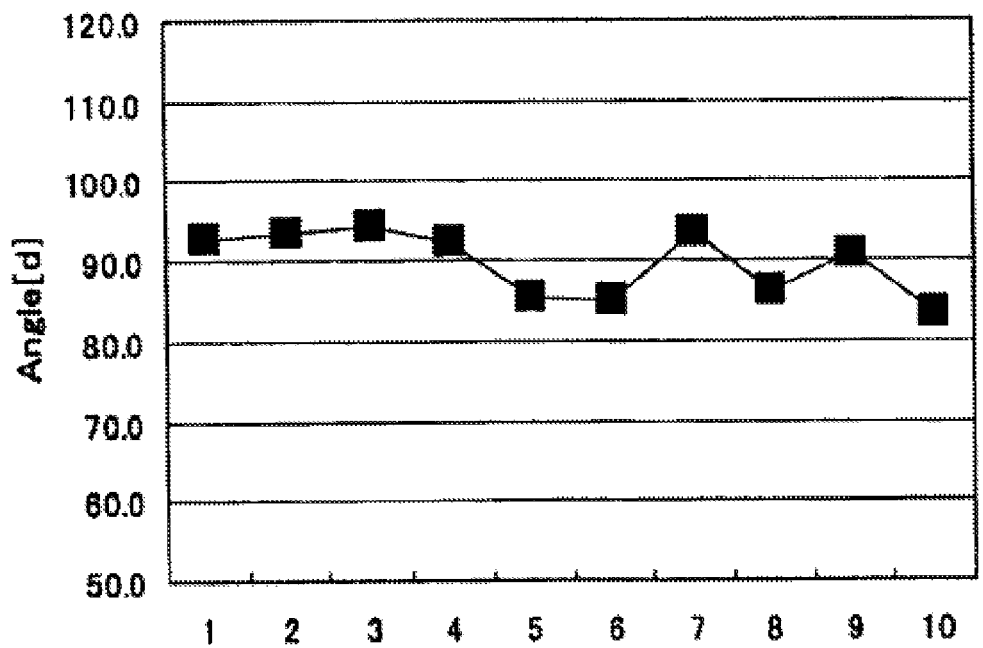
FIG. 4B shows data on contact angles with water after two hours of ultrasonic cleaning of Reference Example.

FIGS. 4(A) and 4(B) show the measurement results of contact angles for the sample of Reference Example. FIG. 4(A) shows the measurement result of contact angles with water after five minutes of ultrasonic cleaning (fatigue); and FIG. 4(B) shows the measurement result of contact angle with water after two hours of ultrasonic cleaning (fatigue). In both figures, the ordinate indicates the contact angle with water and the abscissa indicates the point of measurement on the sample. The measurement was performed at a total of ten points including: four points at the corners of the surface of the rectangular sample; four points at the middles of four sides of the surface; and two points which are positioned on the lines each connecting the opposing two points at the middles of the sides and are equally distanced from the opposing two points. Each of the numbers along the abscissa of FIG. 4 indicates one of these ten measurement points. As shown in FIG. 4(A), high contact angles of about 110° were determined at each measurement point after five minutes of ultrasonic cleaning (fatigue). Accordingly, the fixation ability of the fluorine silane coupling agent layer was sufficiently exhibited for about five minutes of short ultrasonic cleaning (fatigue). FIG. 4(B) shows the measurement result of the contact angles with water in Reference Example after two hours of ultrasonic cleaning (fatigue). As shown in FIG. 4(B), the contact angles with water were reduced to near 90° at all the measurement points. Therefore, the energy of ultrasonic wave presumably removed the fluorine-based silane coupling agent layer. Thus, the sample of Reference Example revealed that the fluorine-based silane coupling agent layer cannot be retained for a long period Accordingly, the sample of Reference Example is not suited for applications requiring a fluorine-based silane coupling agent layer to be retained for a long period, such as mold surface treatment and surface treatment of component conveying feeders.

Figure 5A:
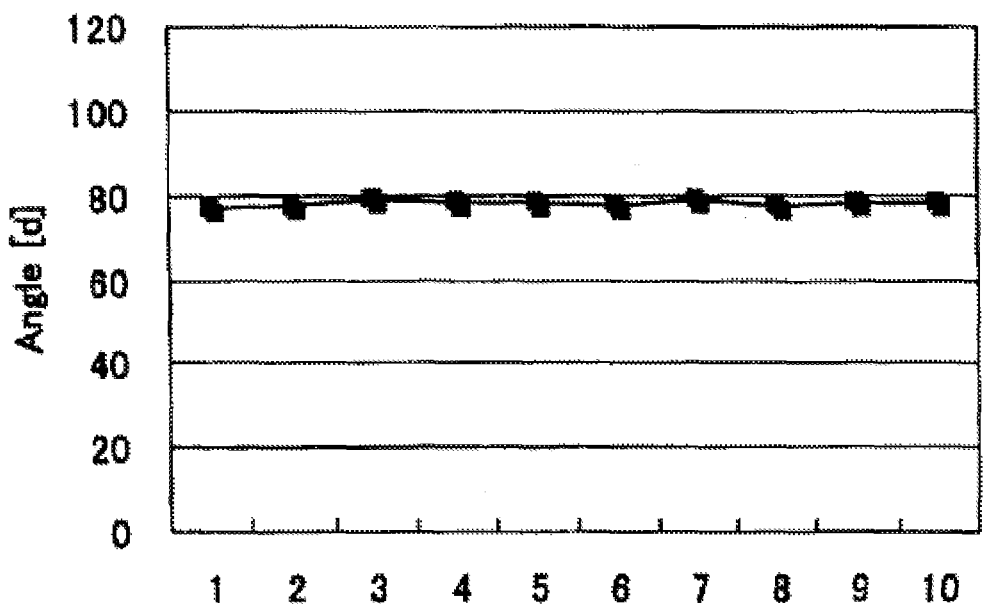
FIG. 5A shows data on contact angles with water before fluorine coating of Comparative Example.
Figure 5B:
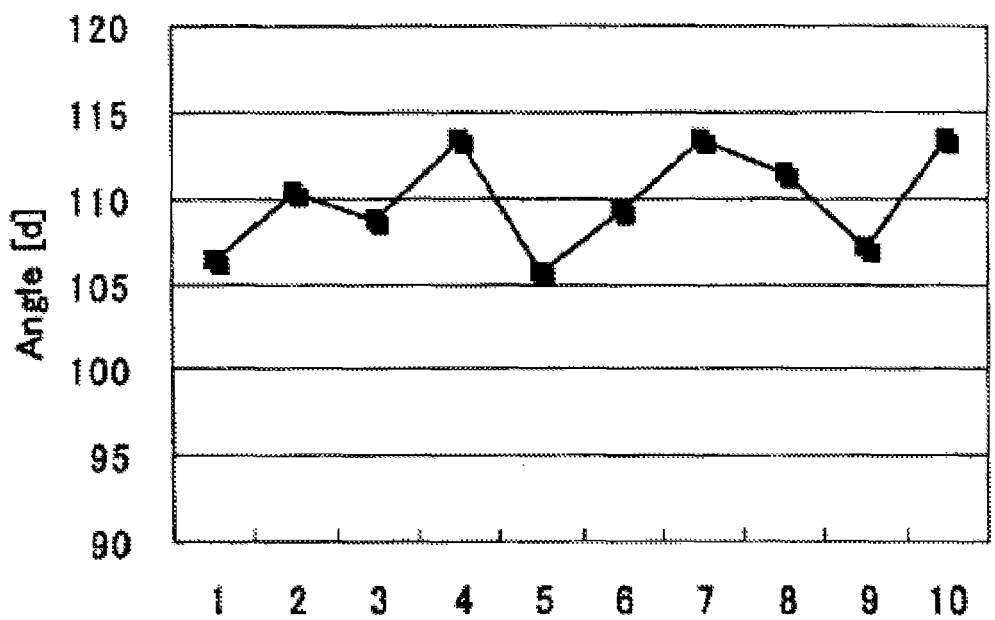
FIG. 5B shows data on contact angles with water after five minutes of ultrasonic cleaning of Comparative Example.
Figure 5C:
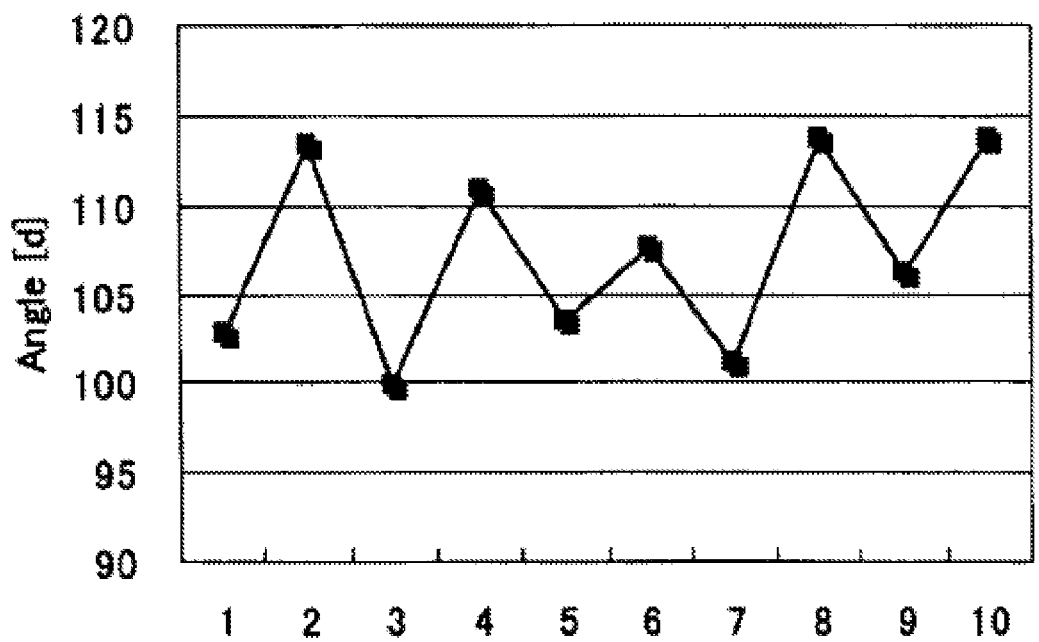
FIG. 5C shows data on contact angles with water after two hours of ultrasonic cleaning of Comparative Example.
Figure 5D:
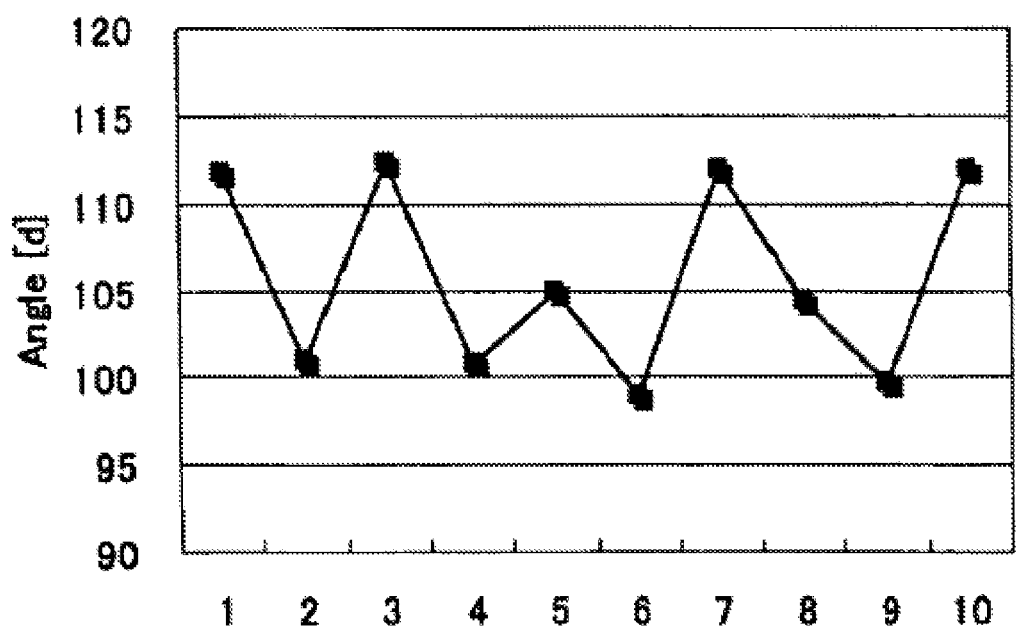
FIG. 5D shows data on contact angles with water after eight hours of ultrasonic cleaning of Comparative Example.

FIGS. 5(A) to 5(D) show the measurement results of contact angles for the samples of Comparative Example. FIG. 5(A) shows the measurement result of the contact angles between the sample of Comparative Example before fluorine coating and water; FIG. 5(B) shows the measurement result of contact angles with water after five minutes of ultrasonic cleaning on the sample of Comparative Example; FIG. 5(C) shows the measurement result of contact angles with water after two hours of ultrasonic cleaning on the sample of Comparative Example; and FIG. 5(D) shows the data of contact angles with water after eight hours of ultrasonic cleaning (fatigue). As shown in FIG. 5(A), the measurement values of contact angles in the sample of Comparative Example were stable near water repellence at each measurement point before fluorine coating; however, as shown in FIG. 5(B), the contact angles with water after five minutes of ultrasonic cleaning were varied among the measurement points. Accordingly, it was confirmed that uniformity is lacking in the boding between the amorphous carbon film containing silicon but not containing nitrogen and the fluorine-based silane coupling agent. As understood from FIG. 5(C), the contact angles measured after two hours of ultrasonic cleaning (fatigue) were varied among the measurement points; and at some measurement points, the measured contact angles were near those of silicone resin under fluorine. Further, as understood from FIG. 5(D), contact angles degraded to be almost equal to those of the silicone resin under fluorine were obtained at some measurement points; and the measured contact angles were largely varied among the measurement points. Thus, it was confirmed that there is a problem to be overcome on the fixation ability of the fluorine-based silane coupling agent in the sample of Comparative Example.

Figure 6A:
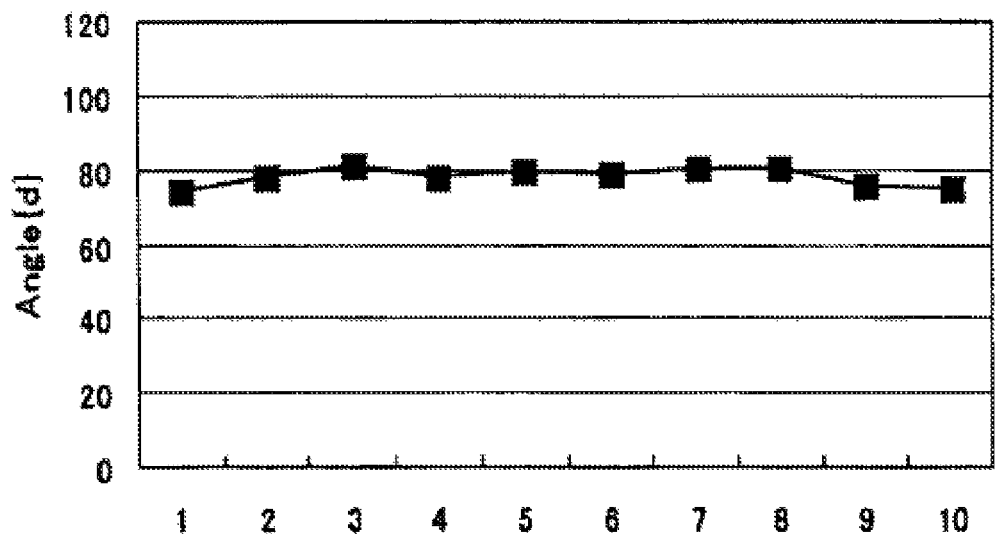
FIG. 6A shows data on contact angles with water before fluorine coating of Example 1.
Figure 6B:
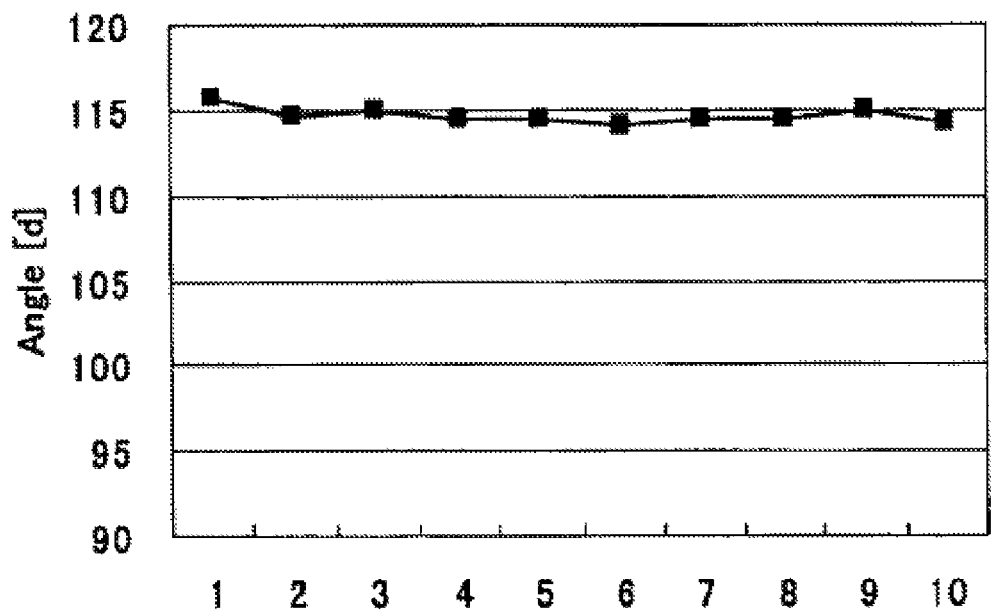
FIG. 6B shows data on contact angles with water after five minutes of ultrasonic cleaning of Example 1.
Figure 6C:
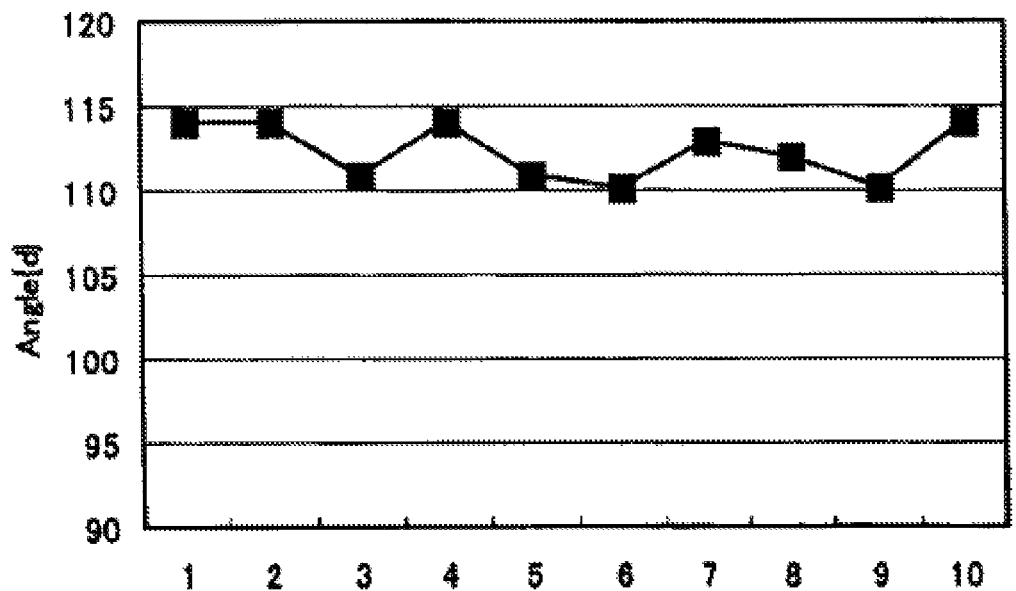
FIG. 6C shows data on contact angles with water after two hours of ultrasonic cleaning of Example 1.
Figure 6D:
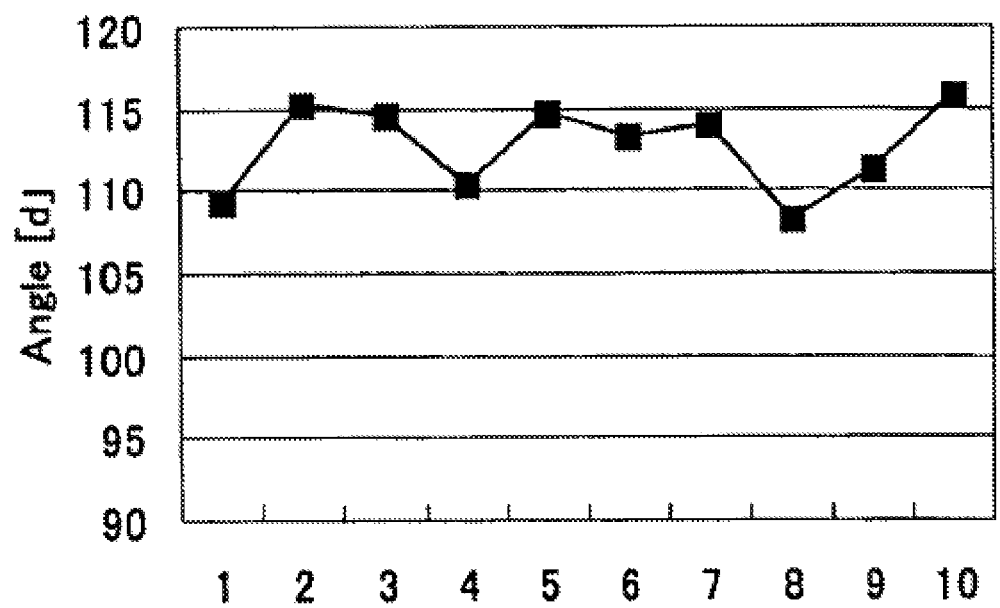
FIG. 6D shows data on contact angles with water after eight hours of ultrasonic cleaning of Example 1.

FIGS. 6(A) to 6(D) show the measurement results of contact angles for the samples of Example 1. FIG. 6(A) shows the measurement result of the contact angles between the sample of Example 1 before fluorine coating and water; FIG. 6(B) shows the measurement result of contact angles with water after five minutes of ultrasonic cleaning (fatigue) on the sample of Example 1; FIG. 6(C) shows the measurement result of contact angles with water after two hours of ultrasonic cleaning (fatigue) on the sample of Example 1; and FIG. 6(D) shows the measurement result of contact angles with water after eight hours of ultrasonic cleaning (fatigue). Comparison between FIG. 6(A) and FIG. 6(B) reveals that the fluorine coating increased the contact angles between the sample of Example 1 and water by an average of about 35°. As shown in FIGS. 6(B) to 6(D), any of the contact angles measured after five minutes, two hours, and eight hours of ultrasonic cleaning (fatigue) was stable at high values as compared to those of Comparative Example.

Figure 7A:
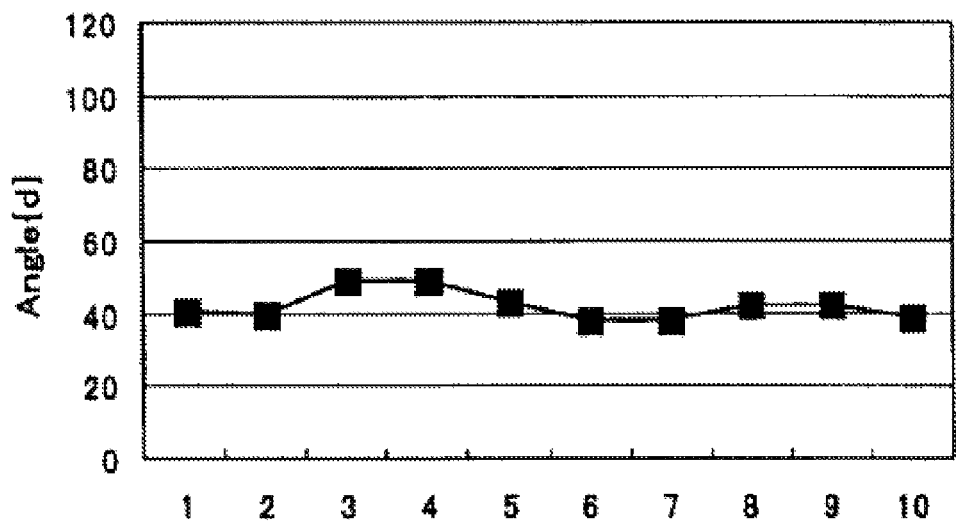
FIG. 7A shows data on contact angles with water before fluorine coating of Example 2.
Figure 7B:
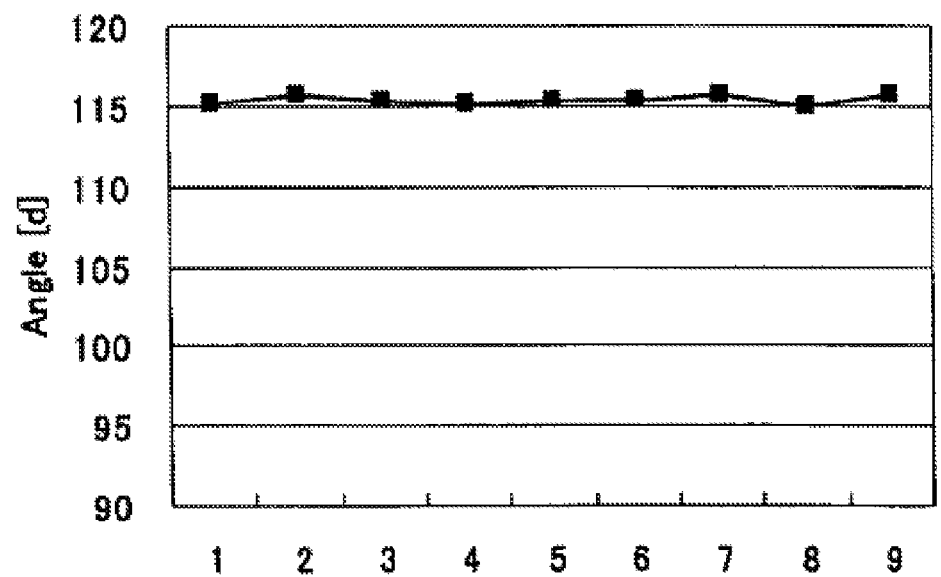
FIG. 7B shows data on contact angles with water after five minutes of ultrasonic cleaning of Example 2.
Figure 7C:
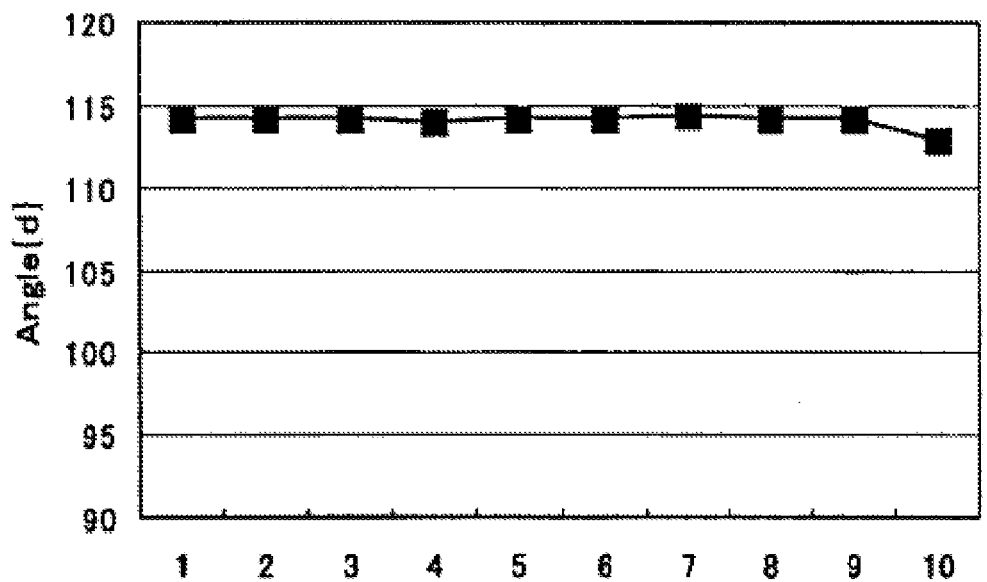
FIG. 7C shows data on contact angles with water after two hours of ultrasonic cleaning of Example 2.
Figure 7D:
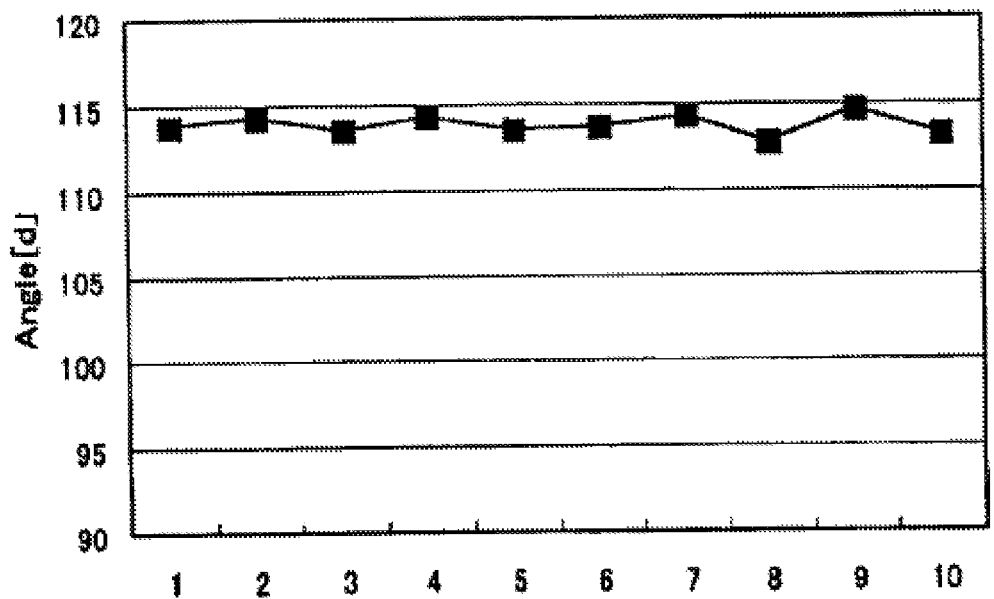
FIG. 7D shows data on contact angles with water after eight hours of ultrasonic cleaning of Example 2.

FIGS. 7(A) to 7(D) show the measurement results of contact angles for the samples of Example 2. FIG. 7(A) shows the measurement result of the contact angles between the sample of Example 2 before fluorine coating and water; FIG. 7(B) shows the measurement result of contact angles with water after five minutes of ultrasonic cleaning (fatigue) on the sample of Example 2; FIG. 7(C) shows the measurement result of contact angles with water after two hours of ultrasonic cleaning (fatigue) on the sample of Example 2; and FIG. 7(D) shows the measurement result of contact angles with water after eight hours of ultrasonic cleaning (fatigue). FIG. 7(A) confirms that a hydrophilic surface can be produced by plasma process with nitrogen on an amorphous carbon film containing silicon. FIG. 7(B) indicates that the fluorine coating increased the contact angle with water measured at the measurement points to about 115°. FIG. 7(C) confirms that contact angles larger than those of Comparative Example were retained even after two hours of ultrasonic cleaning (fatigue), the contact angles being near those of fluorine of about 115°. Further, the contact angles measured at the measurement points were stable. FIG. 7(D) confirms that there is almost no degradation of the contact angles between those measured after two hours of ultrasonic cleaning (fatigue) (see FIG. 7(C)) and those measured after eight hours of the same. Thus, it was confirmed that the sample of Example 2 is superior to the sample of Example 1 in the fixation ability of the fluorine-based silane coupling agent.

Industrial Applicability

The present disclosure may be applied to (1) the surface of various molds required to have demoldability and abrasion resistance, (2) the surface of various substrate-conveying feeders, carriers, container jigs, and cutting instruments required to have abrasion resistance and high slidability and to be protected from stains (3) nonwoven fabric, resin nets, wire nets, and porous sheet (4) packaging resin films and polyethylene terephthalate (PET) bottles required to have gas barrier quality, and (5) resins and rubber seals required to have water- and oil-repellence in addition to abrasion resistance.

What is claimed is:

1. A method comprising the steps of:
   preparing a substrate;
   providing, directly or indirectly on the substrate, an amorphous carbon film layer containing silicon and nitrogen in at least a surface thereof; and
   providing a water- and oil-repellent layer on the amorphous carbon film layer via a coupling agent capable of forming, with the amorphous carbon film layer, hydrogen bonds based on polarity and/or —O-M bonds (M is any one element selected from a group consisting of Si, Ti, Al, and Zr) by condensation reaction with functional groups of the amorphous carbon film layer.

2. The method of claim 1 wherein the coupling agent is a silane coupling agent.

3. The method of claim 1 further comprising the step of performing a plasma process with nitrogen on the amorphous carbon film layer.

4. The method of claim 1 wherein the amorphous carbon film layer comprises two or more layers, of which a topmost layer contains silicon and nitrogen in at least a surface thereof.

5. A method comprising the steps of:
- preparing a substrate;
- providing, directly or indirectly on the substrate, an amorphous carbon film layer containing silicon and nitrogen in at least a surface thereof; and
- providing, on the amorphous carbon film layer, a water- and oil-repellent layer comprising a fluorine-based coupling agent capable of forming, with the amorphous carbon film layer, hydrogen bonds based on polarity and/or —OM bonds (M is any one element selected from a group consisting of Si, Ti, Al, and Zr) by condensation reaction with functional groups of the amorphous carbon film layer.

6. The method of claim 5 wherein the fluorine-based coupling agent is a fluorine-containing silane coupling agent.

7. The method of claim 5 further comprising the step of performing a plasma process with nitrogen on the amorphous carbon film layer.

8. A laminated body comprising:
- a substrate;
- an amorphous carbon film layer containing silicon and nitrogen and provided directly or indirectly on at least one surface of the substrate; and
- a water- and oil-repellent layer provided on the amorphous carbon film layer via a coupling agent capable of forming, with the amorphous carbon film layer, hydrogen bonds based on polarity and/or —O-M bonds (M is any one element selected from a group consisting of Si, Ti, Al, and Zr) by condensation reaction with functional groups of the amorphous carbon film layer.

9. The laminated body of claim 8 wherein the coupling agent is a silane coupling agent.

* * * * *